(12) United States Patent
Suzuki et al.

(10) Patent No.: US 7,851,880 B2
(45) Date of Patent: Dec. 14, 2010

(54) SOLID-STATE IMAGING DEVICE

(75) Inventors: Masami Suzuki, Tokyo (JP);
Yoshimichi Harada, Kanagawa (JP);
Yoshihiro Nabe, Tokyo (JP); Yuji Takaoka, Kanagawa (JP); Masaaki Takizawa, Kanagawa (JP); Chiaki Sakai, Kanagawa (JP)

(73) Assignee: Sony Corporation, Tokyo (JP)

( * ) Notice: Subject to any disclaimer, the term of this patent is extended or adjusted under 35 U.S.C. 154(b) by 209 days.

(21) Appl. No.: 11/944,831

(22) Filed: Nov. 26, 2007

(65) Prior Publication Data

US 2008/0128848 A1 Jun. 5, 2008

(30) Foreign Application Priority Data

Nov. 30, 2006 (JP) ............................. 2006-323042

(51) Int. Cl.
*H01L 31/0224* (2006.01)
*H01L 23/48* (2006.01)
(52) U.S. Cl. ..................... 257/448; 257/433; 257/434; 257/446; 257/774; 257/781; 257/E21.597; 257/E23.011; 257/E31.124
(58) Field of Classification Search ................. 257/433, 257/434, 446, 448, 774, 777, E23.011, E31.124
See application file for complete search history.

(56) References Cited

U.S. PATENT DOCUMENTS 7,180,149 B2 * 2/2007 Yamamoto et al. .......... 257/434
7,531,375 B2 * 5/2009 Wataya ...................... 438/65
2006/0071347 A1 * 4/2006 Dotta ......................... 257/781
2007/0057339 A1 * 3/2007 Mitsui et al. ................ 257/432

FOREIGN PATENT DOCUMENTS

| JP | 2001-284394 | 10/2001 |
| JP | 2005-202101 | 7/2005 |
| JP | 2005-252230 | 9/2005 |
| JP | 2005-260081 | 9/2005 |
| JP | 2007-194498 | 8/2007 |

OTHER PUBLICATIONS

Office Action issued on April 7, 2009, in the related Japanese Application JP 2006-323042.
The package structure of CCD WLP, SEMI Forum Japan 2005 Abstract, p. 46 (JISSO Seminar Jun. 7, 2005 SEMI Japan.
Japanese Office Action issued on Aug. 11, 2009 in connection with JP Application No. 2006-323042.

* cited by examiner

*Primary Examiner*—Matthew E Warren
*Assistant Examiner*—David Spalla
(74) *Attorney, Agent, or Firm*—SNR Denton US LLP

(57) ABSTRACT

A solid-state imaging device includes a semiconductor substrate having a foreside provided with an imaging area and an electrode pad, the imaging area having an array of optical sensors, the electrode pad being disposed around a periphery of the imaging area; a transparent substrate joined to the foreside of the semiconductor substrate with a sealant therebetween; underside wiring that extends through the semiconductor substrate from the electrode pad to an underside of the semiconductor substrate; and a protective film composed of an inorganic insulating material and interposed between the semiconductor substrate and the sealant, the protective film covering at least the electrode pad.

7 Claims, 6 Drawing Sheets

US 7,851,880 B2

SOLID-STATE IMAGING DEVICE

CROSS REFERENCES TO RELATED APPLICATIONS

The present invention contains subject matter related to Japanese Patent Application JP 2006-323042 filed in the Japanese Patent Office on Nov. 30, 2006, the entire contents of which are incorporated herein by reference.

BACKGROUND OF THE INVENTION

1. Field of the Invention

The present invention relates to solid-state imaging devices, and particularly, to a solid-state imaging device that includes an electrode pad on a foreside of a semiconductor substrate and underside wiring extending through the semiconductor substrate from an underside of the semiconductor substrate so as to be connected to the electrode pad.

2. Description of the Related Art

As a small-size optical sensor device, a solid-state imaging device has been reported, which is formed by bonding a transparent substrate onto a peripheral region of an imaging-area face of a chip-size semiconductor substrate with a sealant, forming a through hole that extends from an underside of the semiconductor substrate to an electrode pad extending around the imaging-area face, and then forming underside wiring by filling the through hole with a conductive material. Specifically, in order to form solid-state imaging devices of the aforementioned type, a transparent substrate is first bonded onto a wafer. Then, after forming the underside wiring, the transparent substrate and the wafer are segmented into pieces so that each device is formed into a chip-size package. Examples of such a solid-state imaging device are disclosed in Japanese Unexamined Patent Application Publication No. 2005-202101 and in Preprint for Association of Super-Advanced Electronics Technologies (ASET): SEMI Forum Japan 2005, p. 46 (JISSO Seminar, Jun. 7, 2005, SEMI Japan).

An example of a solid-state imaging device of the related art will be described below with reference to FIG. 8. A solid-state imaging device 10 shown in FIG. 8 includes a transparent substrate 22 and a semiconductor substrate 11 that are bonded to each other with a sealant 21 therebetween. The semiconductor substrate 11 has thereon an imaging area S having an array of optical sensors and an electrode pad 12 extending from the imaging area S.

The imaging area S is provided at a central section on a foreside of the semiconductor substrate 11. The semiconductor substrate 11 has an insulating film 13 composed of, for example, silicon oxide ($SiO_2$) disposed thereon. The electrode pad 12 is disposed on the insulating film 13 and extends along the periphery of the semiconductor substrate 11. The electrode pad 12 is formed of, for example, a thin aluminum (Al) film having a thickness of about several hundreds of nanometers.

The semiconductor substrate 11 and the insulating film 13 have a through hole 14 that extends from the electrode pad 12 to an underside 11a of the semiconductor substrate 11. An insulating film 15 is provided on the underside 11a of the semiconductor substrate 11 and covers the sidewalls of the through hole 14. At the underside of the semiconductor substrate 11, underside wiring 16 formed of a copper (Cu) film with a thickness of several tens of micrometers is provided, such that the underside wiring 16 covers the inner walls of the through hole 14 covered with the insulating film 15.

An underside-protection resin 17 is provided above the underside wiring 16 and the insulating film 15 and is embedded in the through hole 14. The underside-protection resin 17 is given an opening 17a through which the underside wiring 16 is exposed. The underside wiring 16 exposed through this opening 17a has a bump 18 disposed thereon, which serves as an external connection terminal.

On the other hand, the sealant 21 is composed of an organic insulating material having adhesion properties and is formed to a thickness of several tens of micrometers on a side of the semiconductor substrate 11 where the electrode pad 12 is disposed. With this sealant 21, the transparent substrate 22 formed of a glass plate is bonded to the semiconductor substrate 11.

SUMMARY OF THE INVENTION

Referring to FIG. 9, in the solid-state imaging device 10 described above, the electrode pad 12 formed of a thin Al film having a thickness of several hundreds of nanometers is sandwiched between and in contact with the sealant 21 having a thickness of several tens of micrometers and the underside wiring 16. Since the glass transition temperature (Tg) of the sealant 21 is generally low, if the underside wiring 16 thermally expands as a result of a reflow soldering process performed for forming the bump 18 or a heating process performed for forming the underside wiring 16, the sealant 21 may flow and thus cause stress concentration on the electrode pad 12. This stress concentration on the electrode pad 12 can cause a crack $D_1$ to form in the insulating film 13 having a coefficient of linear expansion that differs from that of a metallic material constituting the underside wiring 16 by about two digits. If the material constituting the sealant 21 undergoes plastic deformation, detachment $D_2$ can occur at the bottom of the through hole 14, thus leading to disconnection.

It is desirable to provide a solid-state imaging device that is free of damages, such as disconnection caused by stress concentration on an electrode pad.

A solid-state imaging device according to an embodiment of the present invention includes a semiconductor substrate having a foreside provided with an imaging area and an electrode pad, the imaging area having an array of optical sensors, the electrode pad being disposed around a periphery of the imaging area; a transparent substrate joined to the foreside of the semiconductor substrate with a sealant therebetween; underside wiring that extends through the semiconductor substrate from the electrode pad to an underside of the semiconductor substrate; and a protective film composed of an inorganic insulating material and interposed between the semiconductor substrate and the sealant, the protective film covering at least the electrode pad.

According to this solid-state imaging device, the protective film composed of an inorganic insulating material is interposed between the electrode pad and the sealant. This prevents the electrode pad from being sandwiched between and in contact with the sealant and the underside wiring. In addition, an inorganic insulating material is generally more rigid than the sealant composed of an organic insulating material. Therefore, even when a manufacturing process that involves a heat treatment step causes thermal expansion of the underside wiring, stress concentration on the electrode pad can be reduced since the electrode pad is covered with the protective film. Accordingly, the electrode pad and the underside wiring are prevented from becoming detached from each other as a result of stress concentration on the electrode pad, thereby preventing the solid-state imaging device from being damaged.

A solid-state imaging device according to another embodiment of the present invention includes a semiconductor substrate having a foreside provided with an imaging area and an electrode pad, the imaging area having an array of optical sensors, the electrode pad being disposed around a periphery of the imaging area; a transparent substrate joined to the foreside of the semiconductor substrate with a sealant therebetween; and underside wiring that extends through the semiconductor substrate from the electrode pad to an underside of the semiconductor substrate. The electrode pad is given a thickness that is greater than a film thickness of a wiring material constituting the underside wiring.

According to this solid-state imaging device, the electrode pad is given a thickness that is greater than the film thickness of the wiring material constituting the underside wiring. Consequently, even though the electrode pad is sandwiched between and in contact with the sealant and the underside wiring, an adverse effect caused by stress concentration on the electrode pad due to thermal expansion of the underside wiring during a heat treatment step in the manufacturing process can be reduced. Accordingly, the electrode pad and the underside wiring are prevented from becoming detached from each other as a result of stress concentration on the electrode pad, thereby preventing the solid-state imaging device from being damaged.

According to the solid-state imaging device of each of the aforementioned embodiments of the present invention, the solid-state imaging device is prevented from being damaged during a heat treatment step in a manufacturing process, thereby enhancing the reliability of the solid-state imaging device as well as achieving a higher yield rate.

DESCRIPTION OF THE PREFERRED EMBODIMENTS

Embodiments of the present invention will now be described with reference to the drawings.

First Embodiment

Figure 1A:
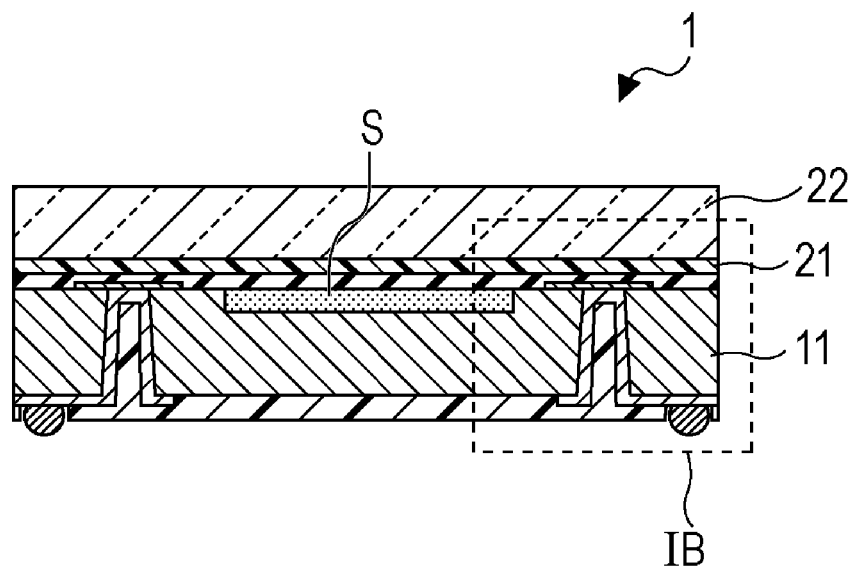
FIGS. 1A and 1B are a cross-sectional view and a partially enlarged cross-sectional view, respectively, showing a solid-state imaging device according to a first embodiment of the present invention.
Figure 1B:
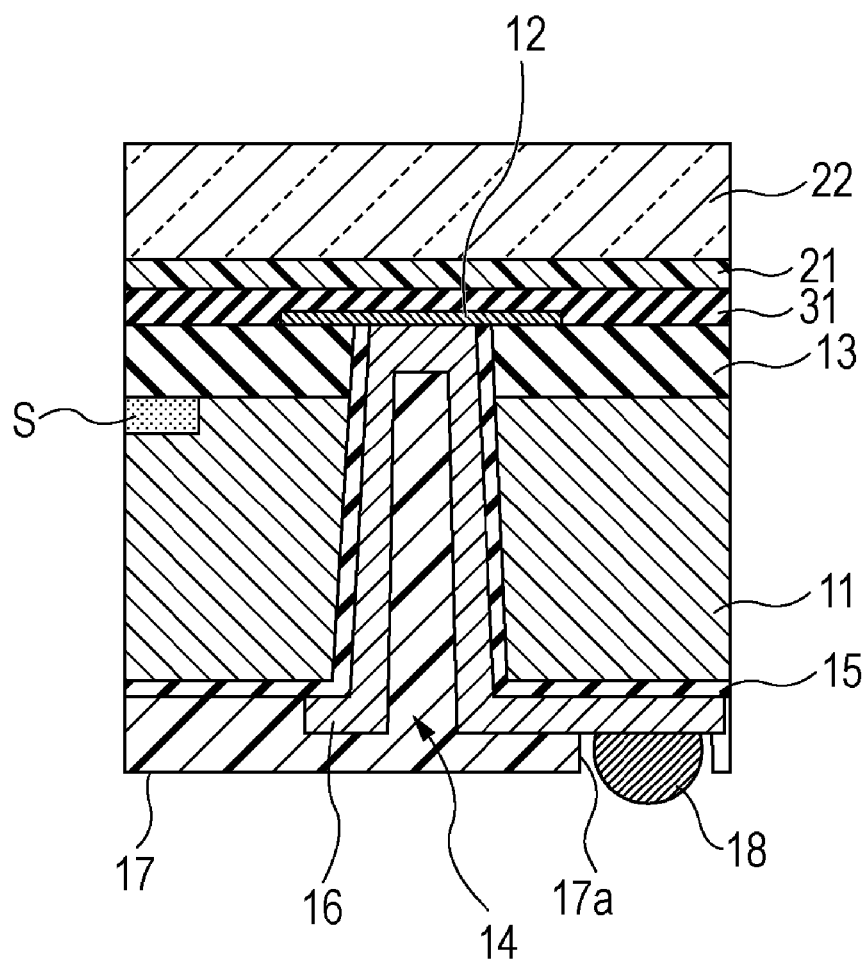

FIG. 1A is a cross-sectional view showing a solid-state imaging device according to a first embodiment of the present invention. FIG. 1B is an enlarged cross-sectional view of region IB in FIG. 1A. Components that are the same as those in the related art are given the same reference numerals.

A solid-state imaging device 1 shown in FIGS. 1A and 1B includes a transparent substrate 22 and a semiconductor substrate 11 that are bonded to each other with a sealant 21 therebetween. The semiconductor substrate 11 has thereon an imaging area S having an array of optical sensors and an electrode pad 12 extending from the imaging area S.

The imaging area S is provided at a central section on a foreside of the semiconductor substrate 11 composed of, for example, silicon. The array of optical sensors in the imaging area S may be of a CCD-type or an MOS-type. The semiconductor substrate 11 has an insulating film 13 composed of, for example, $SiO_2$ disposed thereon. The electrode pad 12 is disposed on the insulating film 13 and extends along the periphery of the semiconductor substrate 11. The electrode pad 12 is formed of, for example, a thin aluminum film having a thickness of about several hundreds of nanometers. Other than aluminum (Al), the material used for the electrode pad 12 includes copper (Cu), gold (Au), or silver (Ag). Although not shown, a barrier layer composed of titanium (Ti)/titanium nitride (TiN) or tantalum (Ta)/tantalum nitride (TaN) underlies the electrode pad 12 so as to prevent diffusion of the conductive material from the electrode pad 12 to the insulating film 13.

The semiconductor substrate 11 and the insulating film 13 have a through hole 14 that extends from the electrode pad 12 to an underside 11a of the semiconductor substrate 11. The through hole 14 has a diameter that is smaller than that of the electrode pad 12. The sidewalls of the through hole 14 and the underside 11a of the semiconductor substrate 11 are entirely covered with an insulating film 15 composed of, for example, $SiO_2$ and having a thickness of several micrometers. Underside wiring 16 formed of a copper film with a thickness of several tens of micrometers is disposed on the insulating film 15 with a barrier layer (not shown) interposed therebetween, such that the underside wiring 16 covers the inner walls of the through hole 14 covered with the insulating film 15. The barrier layer is composed of, for example, Ti/Tin and is capable of preventing diffusion of copper.

An underside-protection resin 17 is provided above the underside wiring 16 and the insulating film 15 and is embedded in the through hole 14. The underside-protection resin 17 is given an opening 17a through which the underside wiring 16 is exposed. The underside wiring 16 exposed through this opening 17a has a bump 18 disposed thereon, which serves as an external connection terminal.

Although the above description is directed to an example where the underside wiring 16 covers the inner walls of the through hole 14, the underside wiring 16 is not particularly limited in shape and may alternatively be embedded in the through hole 14.

In the first embodiment, the semiconductor substrate 11 and the sealant 21 have interposed therebetween a protective film 31 composed of an inorganic insulating material, such that the protective film 31 covers at least the electrode pad 12.

This prevents the electrode pad 12 from being sandwiched between and in contact with the sealant 21 and the underside wiring 16. The protective film 31 composed of an inorganic insulating material is generally more rigid than the sealant 21 composed of an organic insulating material. Therefore, for example, when a heat treatment step is performed for forming the underside wiring 16 or the underside-protection resin 17 and causes thermal expansion of the underside wiring 16, stress concentration on the electrode pad 12 caused by the thermal expansion can be reduced.

The inorganic insulating material used for the protective film 31 is preferably an optically transparent insulating material, and is generally silicon dioxide ($SiO_2$) or silicon nitride (SiN). The protective film 31 may either be a single-layer film or a multilayer film. In this case, the protective film 31 is, for example, a SiN film.

Although the above description is directed to an example where the protective film 31 is disposed entirely over the insulating film 13 so as to cover the electrode pad 12, the protective film 31 may be patterned such that it covers at least the electrode pad 12.

On the other hand, the sealant 21 is disposed so as to cover at least an area of the protective film 31 that extends along the periphery of the semiconductor substrate 11. Here, the sealant 21 is provided so as to entirely cover the protective film 31. In this case, the sealant 21 is composed of, for example, an optically transparent organic insulating material that has adhesion properties, and is disposed on the protective film 31 while being given a thickness of several tens of micrometers. For the sealant 21, a thermosetting resin or an ultraviolet curable resin may be used. In this case, a thermosetting epoxy resin, for example, is used.

The transparent substrate 22 formed of, for example, a glass plate is bonded onto the semiconductor substrate 11 having the protective film 31 thereon with the sealant 21 interposed between the transparent substrate 22 and the semiconductor substrate 11. The transparent substrate 22 may be composed of a typical glass lens material, quartz, or crystal. The transparent substrate 22 and the semiconductor substrate 11 have the same shape in plan view.

The solid-state imaging device 1 described above is manufactured in the following manner.

First, a semiconductor wafer having an array of sections corresponding to semiconductor substrates 11 of solid-state imaging devices 1 is prepared. The semiconductor wafer has disposed thereon an insulating film 13, which has electrode pads 12 disposed thereon. A protective film 31 composed of SiN is formed on the insulating film 13 so as to cover at least the electrode pads 12. Subsequently, a transparent substrate having the same size as the semiconductor wafer is bonded to the semiconductor wafer with a sealant 21 therebetween. This bonding process involves applying the sealant 21 over the semiconductor wafer or the transparent substrate by, for example, spin coating and then bonding the semiconductor wafer and the transparent substrate together. The sealant 21 is then cured by heating or ultraviolet radiation. In a case where a photosensitive material is used as the sealant 21, the sealant 21 is cured by heating.

The semiconductor wafer having the transparent substrate 22 bonded thereto has its underside subject to grinding so that the thickness of the semiconductor substrates 11 to be formed is reduced to, for example, 100 µm or less. Subsequently, through holes 14 extending to the bottom surfaces of the electrode pads 12 are formed from the underside of the semiconductor wafer by, for example, laser machining, photolithography, or reactive ion etching (RIE).

Then, an insulating film 15 composed of, for example, $SiO_2$ is formed entirely over the underside of the semiconductor wafer such that the insulating film 15 covers the sidewalls of the through holes 14. The insulating film 15 may be formed of, for example, an epoxy dry film.

Subsequently, a Ti/TiN barrier film (not shown) and a copper seed layer (not shown) are formed by, for example, sputtering so as to cover the inner walls of the through holes 14 covered with the insulating film 15. A copper film is then formed on the seed layer by electroplating. The barrier film, the seed layer, and the copper film are patterned, thereby forming underside wiring 16.

Subsequently, the semiconductor wafer and the transparent substrate are together cut into individual semiconductor substrates 11, whereby individual solid-state imaging devices 1 are obtained. In this case, cross-sectionally V-shaped grooves are preferably formed on the transparent substrate prior to the cutting step so that the semiconductor wafer and the transparent substrate can be cut along these grooves.

Subsequently, in each semiconductor substrate 11, a laminate film is bonded onto the insulating film 15 so as to fill the through hole 14 having the underside wiring 16 thereon, thereby forming an underside-protection resin 17. An opening 17a is then formed in the underside-protection resin 17 so that the underside wiring 16 is exposed through this opening 17a. On the underside wiring 16 exposed through the opening 17a, a bump 18 composed of Sn—Ag—Cu is formed. Instead of forming the underside-protection resin 17 with a laminate film, the underside-protection resin 17 may be formed by vacuum coating or spray coating. In the above-described manner, a solid-state imaging device 1 is obtained.

In the solid-state imaging device 1, since the protective film 31 composed of an inorganic insulating material is interposed between the electrode pad 12 and the sealant 21, stress concentration on the electrode pad 12 caused by thermal expansion of the underside wiring 16 during a heat treatment step in the manufacturing process can be reduced. Accordingly, the electrode pad 12 and the underside wiring 16 are prevented from becoming detached from each other as a result of stress concentration on the electrode pad 12, thereby preventing the solid-state imaging device 1 from being damaged. This enhances the reliability of the solid-state imaging device 1 as well as achieving a higher yield rate.

Although the first embodiment described above is directed to an example where the sealant 21 composed of an optically transparent organic insulating material is disposed entirely over the protective film 31 that covers the entire semiconductor substrate 11, the sealant 21 may alternatively be disposed so as to cover the area of the electrode pad 12, that is, an area excluding the imaging area S but surrounding the imaging area S. In that case, the sealant 21 may be formed in the following manner. First, the sealant 21 is applied onto the protective film 31 by, for example, spin coating using, for example, photosensitive resin. Then, exposure and development steps are implemented to pattern the sealant 21 so that it is formed in an area excluding the imaging area S. In this case, since the sealant 21 is not formed over the imaging area S, the sealant 21 may be composed of an opaque organic insulating material. Subsequently, as in the first embodiment, a transparent substrate is bonded onto the sealant 21. As a further alternative, the sealant 21 may be formed in an area of the transparent substrate that faces the aforementioned area excluding the imaging area S.

Second Embodiment

Figure 2A:
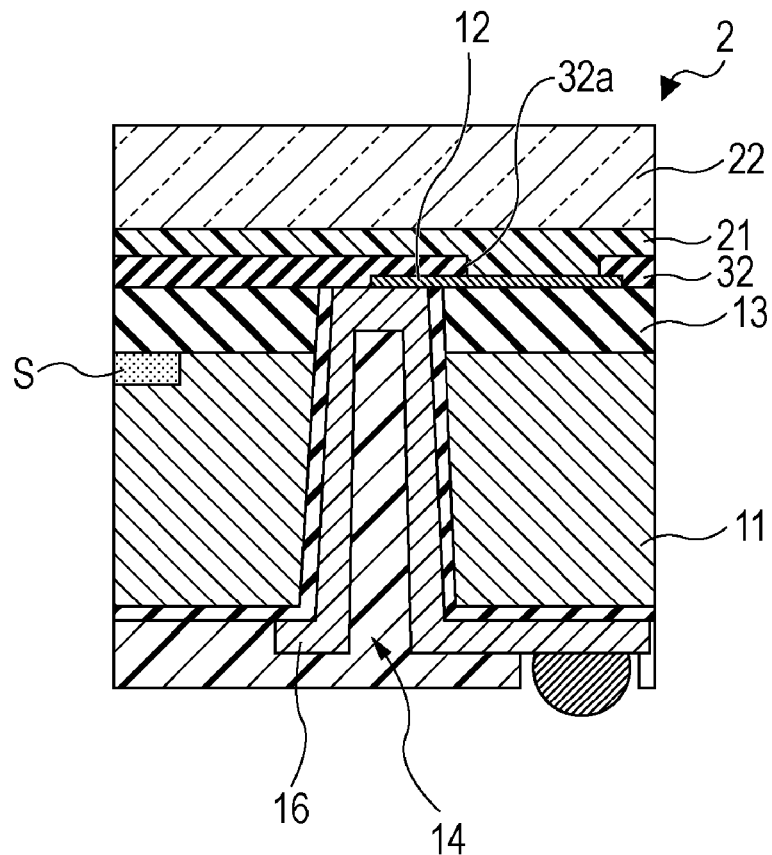
FIGS. 2A and 2B are a partially enlarged cross-sectional view and a plan view, respectively, showing a solid-state imaging device according to a second embodiment of the present invention.
Figure 2B:
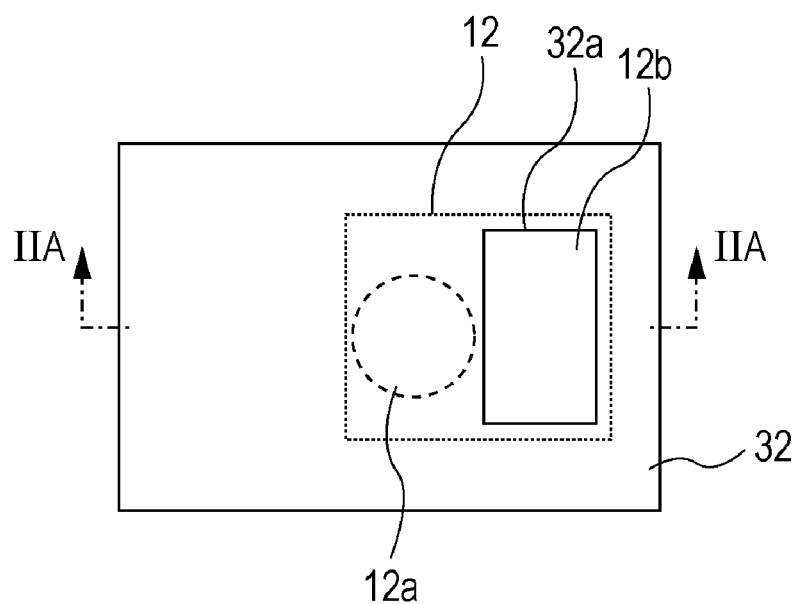

A solid-state imaging device 2 according to a second embodiment of the present invention will now be described with reference to FIGS. 2A and 2B. FIG. 2A is an enlarged cross-sectional view showing a relevant part of the solid-state imaging device 2 and taken along line IIA-IIA in FIG. 2B. FIG. 2B is a top view showing a state where a sealant 21 is not yet formed. In the second embodiment, the components disposed at the underside 11a of the semiconductor substrate 11 including the underside wiring 16 provided within the through hole 14 are the same as those in the first embodiment described above with reference to FIGS. 1A and 1B.

Referring to FIG. 2A, similar to the first embodiment, a protective film 32 composed of an inorganic insulating material is disposed on the insulating film 13 so as to cover the electrode pad 12. Referring to FIG. 2B, in the second embodiment, the electrode pad 12 is segmented into a connection region 12a connected to the underside wiring 16 and an inspection region 12b. The protective film 32 has an opening 32a through which the inspection region 12b is exposed. Consequently, before application of the sealant 21 (see FIG. 2B), a probe may be brought into contact with the inspection region 12b of the electrode pad 12 exposed through the opening 32a so as to inspect whether the optical sensors are defective or non-defective. Referring to FIG. 2A, after the inspection, the transparent substrate 22 is bonded onto the sealant 21 so that the sealant 21 fills the opening 32a.

Because the electrode pad 12 is segmented into the connection region 12a and the inspection region 12b, a probe mark formed by bringing the inspection probe into contact with the electrode pad 12 is prevented from protruding towards an area of the insulating film 13 where the through hole 14 is formed. Consequently, this prevents the electrode pad 12 from being corroded or the underside wiring 16 from being formed defectively, which can occur when process gas or plasma attack used for a machining process on the through hole 14 causes a damage (forms a hole) in the sealant 21, and absorbed matter such as water or chemical in the damaged section is released during the process.

Accordingly, the solid-state imaging device 2 of the second embodiment achieves similar advantages to those achieved by the solid-state imaging device 1 of the first embodiment since the protective film 32 composed of an inorganic insulating material is interposed between the electrode pad 12 and the sealant 21.

Furthermore, in the solid-state imaging device 2 according to the second embodiment, the inspection region 12b of the electrode pad 12 exposed through the opening 32a does not overlap the connection region 12a connected to the underside wiring 16. This prevents defects from occurring due to probe marks.

Third Embodiment

Figure 3:
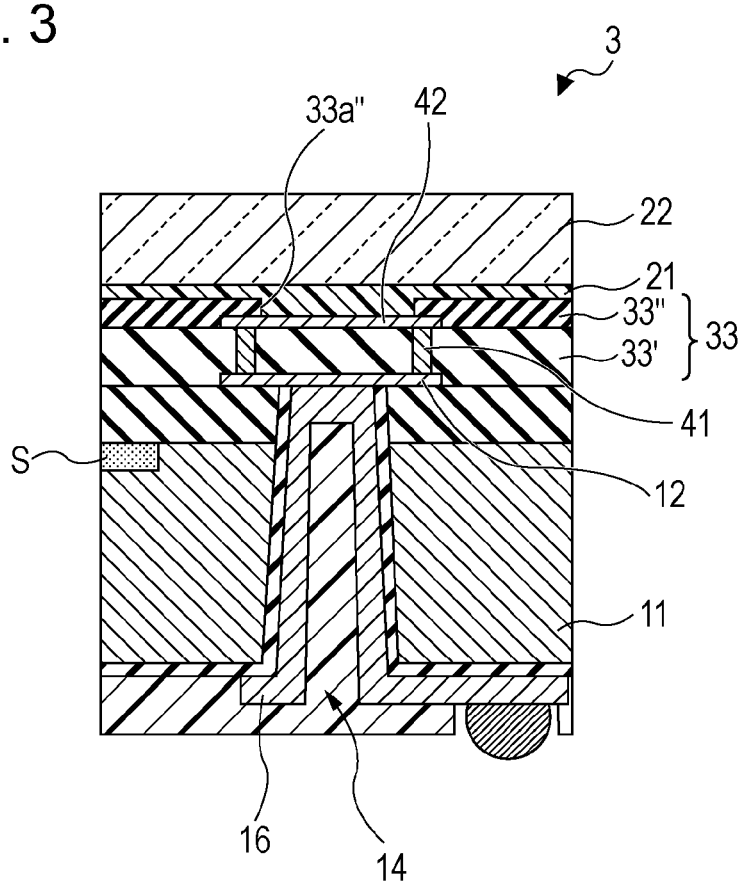
FIG. 3 is an enlarged cross-sectional view showing a relevant part of a solid-state imaging device according to a third embodiment of the present invention.

A solid-state imaging device 3 according to a third embodiment of the present invention will now be described with reference to FIG. 3. FIG. 3 is an enlarged cross-sectional view showing a relevant part of the solid-state imaging device 3. In the solid-state imaging device 3 shown in FIG. 3, the components disposed at the underside 11a of the semiconductor substrate 11 including the underside wiring 16 provided within the through hole 14 are the same as those in the first embodiment described above with reference to FIGS. 1A and 1B.

Referring to FIG. 3, a protective film 33 according to the third embodiment covers the electrode pad 12 and includes a first protective layer 33' disposed on the insulating film 13, and a second protective layer 33" disposed on the first protective layer 33'. As in the first embodiment, the first protective layer 33' and the second protective layer 33" are formed of an inorganic insulating material.

The first protective layer 33' has a via 41 composed of, for example, copper within a via hole with a barrier layer therebetween. The via 41 is connected to the electrode pad 12. An inspection electrode pad 42 composed of, for example, aluminum is disposed on the first protective layer 33' with a barrier layer therebetween in a state such that the inspection electrode pad 42 is connected to the via 41. The inspection electrode pad 42 is disposed so as to overlie, for example, the electrode pad 12 and the underside wiring 16 in plan view.

The second protective layer 33" has an opening 33a" through which a region of the inspection electrode pad 42 that excludes a connection region thereof connected to the via 41 is exposed. By bringing a probe into contact with the surface of the inspection electrode pad 42 exposed through the opening 33a", the components contained in the semiconductor substrate 11 can be inspected. After the inspection, the transparent substrate 22 is bonded onto the sealant 21 so that the sealant 21 fills the opening 33a".

The opening 33a" is preferably provided in a region of the inspection electrode pad 42 that excludes the connection region thereof connected to the via 41. This prevents the inspection electrode pad 42 from being sandwiched between and in contact with the via 41 and the sealant 21, whereby stress concentration on the inspection electrode pad 42 can be reduced.

Accordingly, the solid-state imaging device 3 of the third embodiment achieves similar advantages to those achieved by the solid-state imaging device 1 of the first embodiment since the protective film 33 composed of an inorganic insulating material is interposed between the electrode pad 12 and the sealant 21.

Furthermore, in the solid-state imaging device 3 according to the third embodiment, the inspection electrode pad 42 connected to the electrode pad 12 is provided on a surface of the protective film 33, thereby preventing probe marks from being formed upon performing an inspection for the electrode pad 12 connected to the underside wiring 16.

MODIFICATION EXAMPLE 1

In the solid-state imaging device 3 according to the third embodiment, the inspection electrode pad 42 overlies the connection region of the electrode pad 12 connected to the underside wiring 16 in plan view. However, the position of the inspection electrode pad 42 is not limited to that described above.

Figure 4:
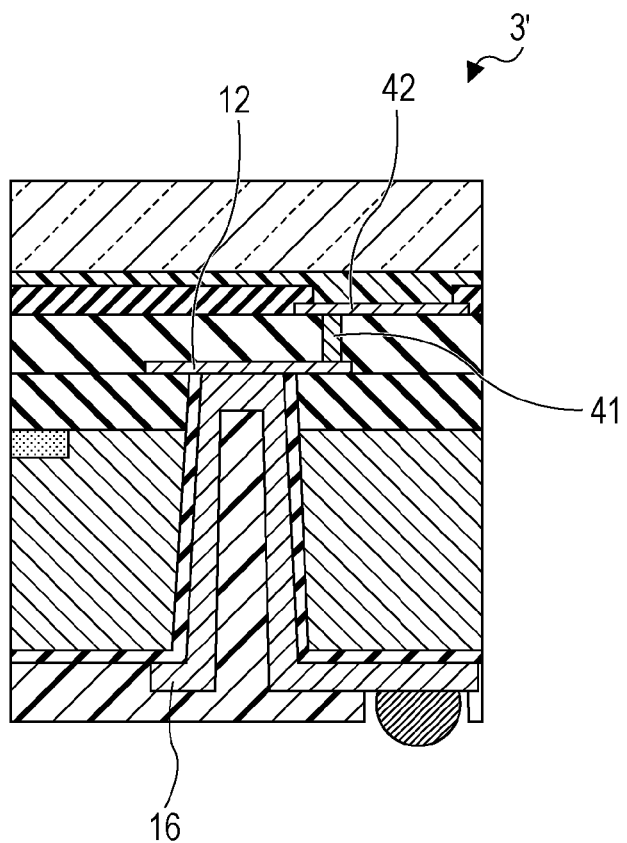
FIG. 4 is an enlarged cross-sectional view showing a relevant part of a solid-state imaging device according to modification example 1 of the third embodiment of the present invention.

Referring to FIG. 4, for example, the inspection electrode pad 42 may be disposed out of alignment with the connection region of the electrode pad 12 connected to the underside wiring 16 in plan view, while the inspection electrode pad 42 is connected to the electrode pad 12 through the via 41.

This solid-state imaging device 3' can also achieve advantages similar to those achieved by the solid-state imaging device 3 of the third embodiment.

Fourth Embodiment

Figure 5:
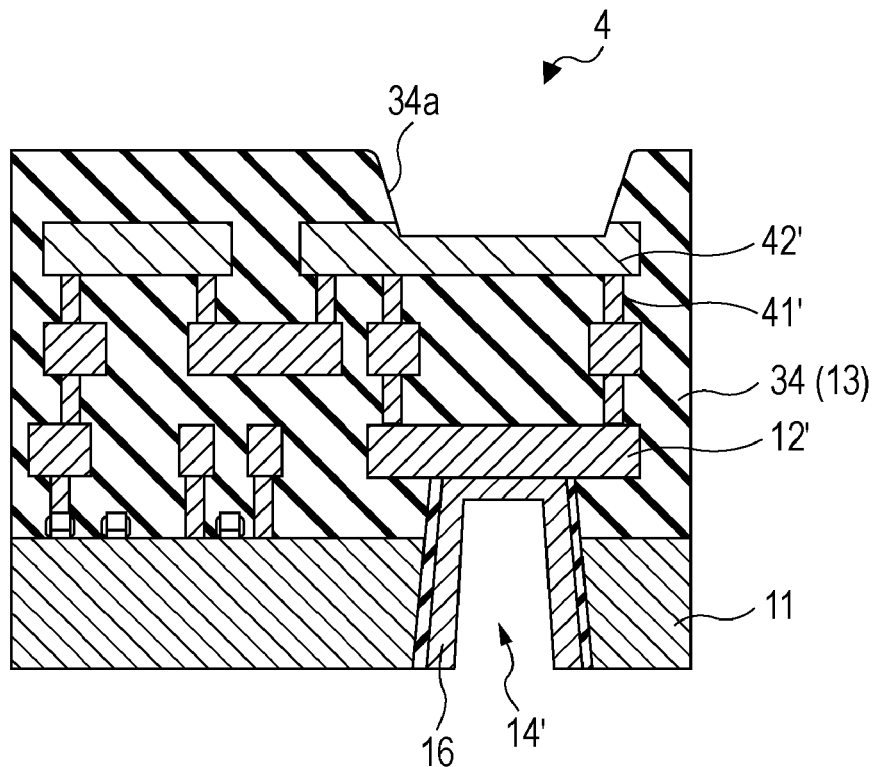
FIG. 5 is an enlarged cross-sectional view showing a relevant part of a solid-state imaging device according to a fourth embodiment of the present invention.

A solid-state imaging device 4 according to a fourth embodiment of the present invention will now be described with reference to FIG. 5. FIG. 5 is an enlarged cross-sectional view showing a relevant part of the solid-state imaging device 4.

In the solid-state imaging device 4 shown in FIG. 5, parts of a multilayer wiring structure within the insulating film 13 extending from the imaging area S described in the first embodiment with reference to FIGS. 1A and 1B are used as an electrode pad 12' and an inspection electrode pad 42'. Of wiring layers constituting the multilayer wiring structure, an uppermost wiring layer including the inspection electrode pad 42' is composed of aluminum and the remaining layers including the electrode pad 12' are composed of copper. In the fourth embodiment, the insulating film 13 shown in FIG. 1B functions as a protective film 34, and both the electrode pad 12' and the inspection electrode pad 42' are contained within the protective film 34.

In this case, a through hole 14' is provided so as to extend to the electrode pad 12' contained in the protective film 34. Similar to the first embodiment, the through hole 14' has the underside wiring 16 provided therein.

Furthermore, the protective film 34 has an opening 34a through which the inspection electrode pad 42' is exposed. An inspection is performed by bringing a probe into contact with the surface of the inspection electrode pad 42' exposed through the opening 34a. After the inspection, the transparent substrate 22 (see FIGS. 1A and 1B) is bonded onto the sealant 21 (see FIGS. 1A and 1B) so that the sealant 21 fills the opening 34a.

The opening 34a is preferably provided in a region of the inspection electrode pad 42' that excludes a connection region thereof connected to a via 41'. This prevents the inspection electrode pad 42' from being sandwiched between and in contact with the via 41' and the sealant 21, whereby stress concentration on the inspection electrode pad 42' can be reduced.

Accordingly, the solid-state imaging device 4 of the fourth embodiment achieves similar advantages to those achieved by the solid-state imaging device 1 of the first embodiment since the protective film 34 composed of an inorganic insulating material is interposed between the electrode pad 12' and the sealant 21.

Furthermore, in the solid-state imaging device 4 according to the fourth embodiment, the inspection electrode pad 42' connected to the electrode pad 12' is located closer to the transparent substrate 22 than to the electrode pad 12', thereby preventing probe marks from being formed on the electrode pad 12' connected to the underside wiring 16.

MODIFICATION EXAMPLE 2

In the solid-state imaging device 4 according to the fourth embodiment, the inspection electrode pad 42' overlies the connection region of the electrode pad 12' connected to the underside wiring 16 in plan view. However, the position of the inspection electrode pad 42' is not limited to that described above.

Figure 6:
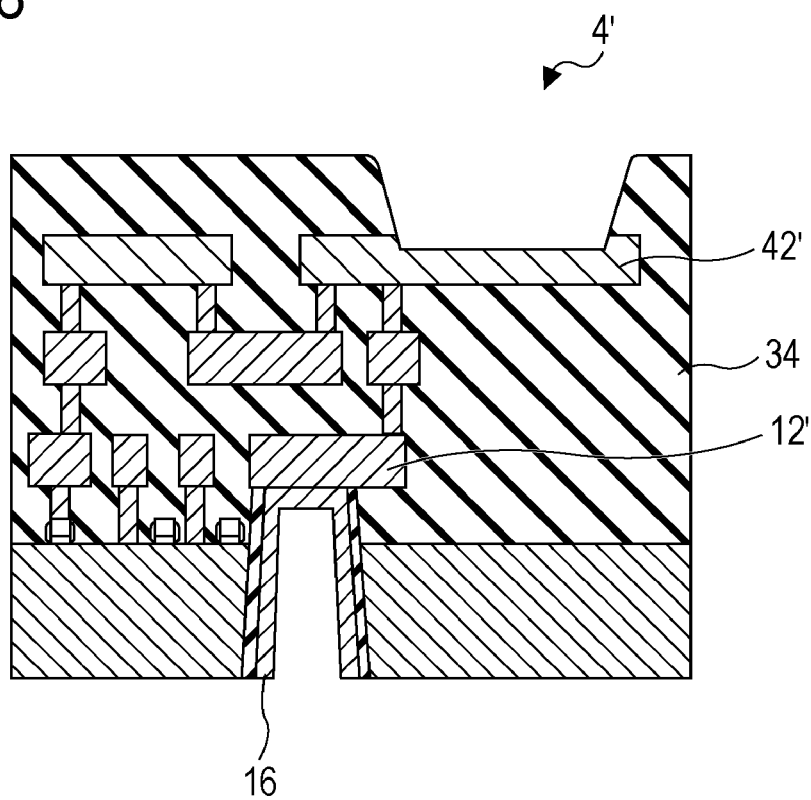
FIG. 6 is an enlarged cross-sectional view showing a relevant part of a solid-state imaging device according to modification example 2 of the fourth embodiment of the present invention.

Referring to FIG. 6, for example, the inspection electrode pad 42' may be disposed out of alignment with the connection region of the electrode pad 12' connected to the underside wiring 16 in plan view, while the inspection electrode pad 42' is connected to the electrode pad 12' through the via 41'.

This solid-state imaging device 4' can also achieve advantages similar to those achieved by the solid-state imaging device 4 of the fourth embodiment.

Fifth Embodiment

Figure 7:
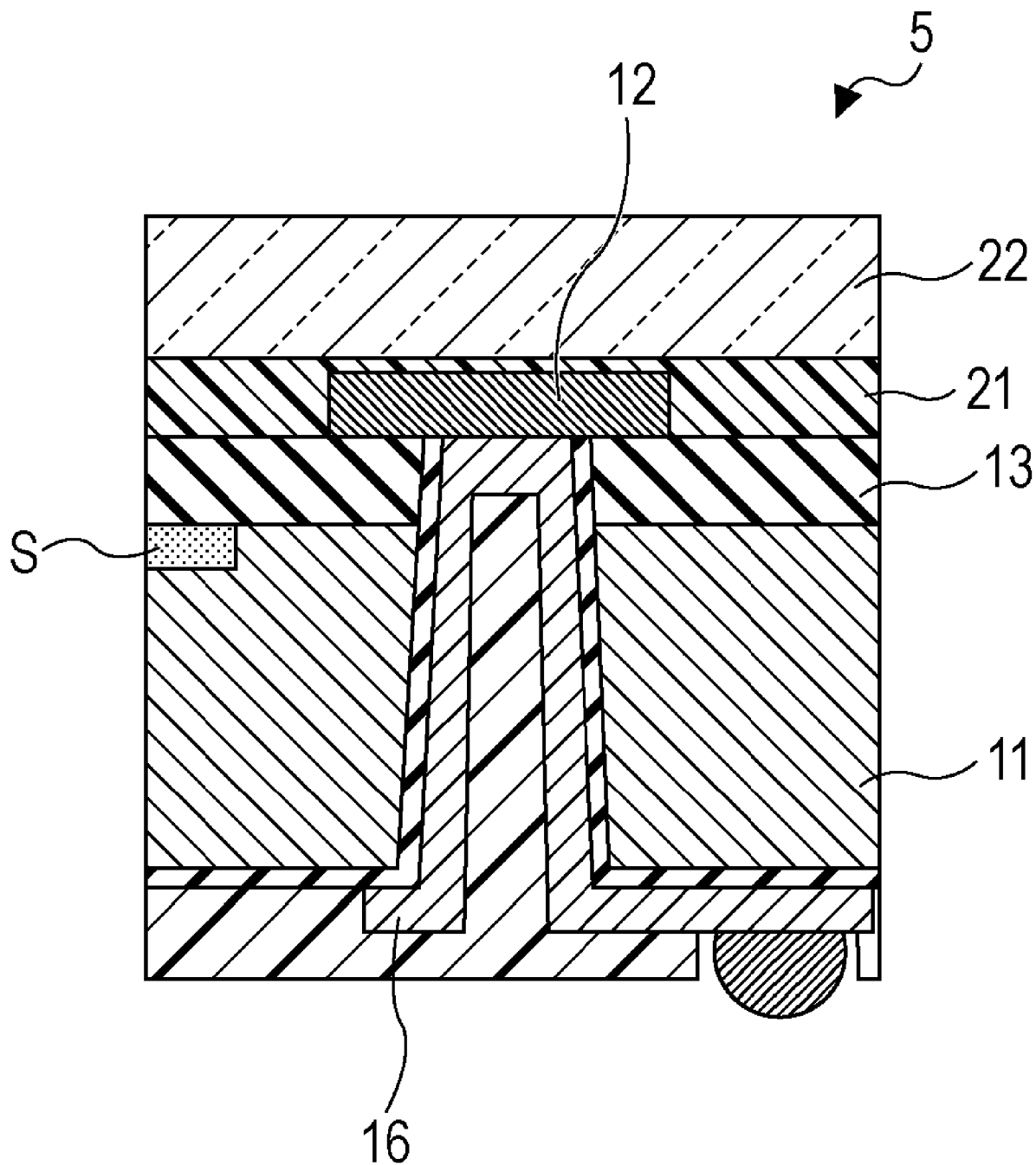
FIG. 7 is an enlarged cross-sectional view showing a relevant part of a solid-state imaging device according to a fifth embodiment of the present invention.
Figure 8:
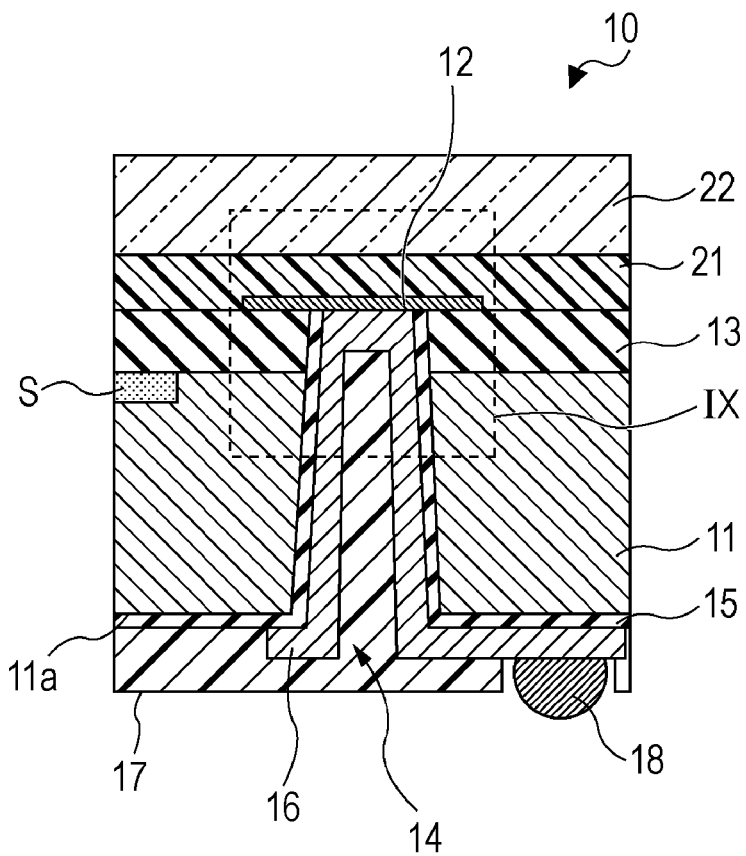
FIG. 8 is an enlarged cross-sectional view showing a relevant part of a solid-state imaging device of related art.
Figure 9:
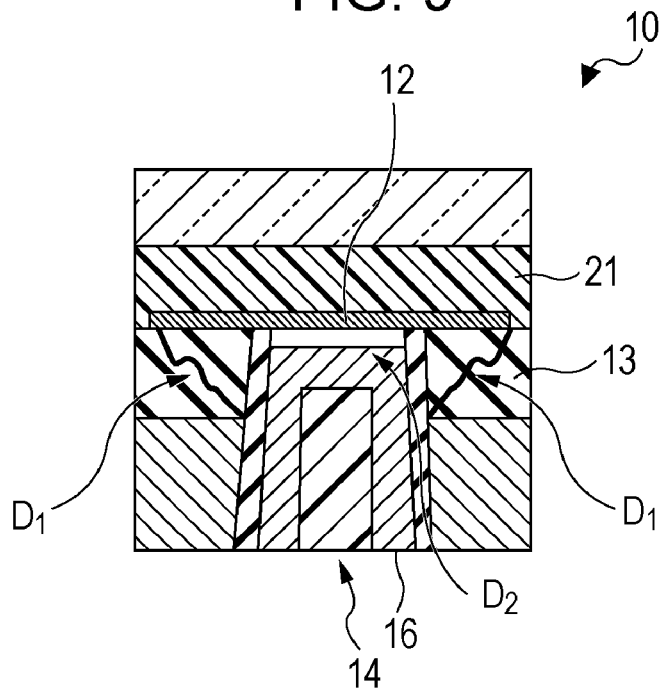
FIG. 9 is a partially enlarged cross-sectional view showing a problem existed in the solid-state imaging device of the related art.

A solid-state imaging device 5 according to a fifth embodiment of the present invention will now be described with reference to FIG. 7. FIG. 7 is an enlarged cross-sectional view showing a relevant part of the solid-state imaging device 5. In the solid-state imaging device 5 shown in FIG. 7, the components disposed at the underside 11a of the semiconductor substrate 11 including the underside wiring 16 provided within the through hole 14 are the same as those in the first embodiment described above with reference to FIGS. 1A and 1B.

Referring to FIG. 7, the solid-state imaging device 5 according to the fifth embodiment does not have the protective film 31 as in the first embodiment described above with reference to FIGS. 1A and 1B, and the electrode pad 12 is given a thickness that is greater than the film thickness of the wiring material constituting the underside wiring 16. Specifically, the electrode pad 12 is given a thickness of several micrometers to several tens of micrometers. Consequently, even if the electrode pad 12 is sandwiched between and in contact with the sealant 21 and the underside wiring 16, stress concentration on the electrode pad 12 caused by thermal expansion of the underside wiring 16 during the manufacturing process that involves a heat treatment step can be reduced.

According to the solid-state imaging device 5, even if stress is concentrated on the electrode pad 12 due to thermal expansion of the underside wiring 16, defects caused by such stress concentration can be prevented from occurring since the electrode pad 12 is given a thickness that is greater than the film thickness of the wiring material constituting the underside wiring 16. Consequently, this prevents the solid-state imaging device 5 from being damaged, thereby enhancing the reliability of the solid-state imaging device 5 as well as achieving a higher yield rate.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a semiconductor substrate having a foreside and an oppositely facing underside, the foreside being provided with an imaging area and an electrode pad, the imaging area having an array of optical sensors, the electrode pad being disposed around a periphery of the imaging area;
    a transparent substrate secured to the foreside of the semiconductor substrate with a sealant therebetween;
    underside wiring that extends through the semiconductor substrate from the electrode pad to the underside of the semiconductor substrate; and
    a protective film composed of an inorganic insulating material and interposed between the semiconductor substrate and the sealant, the protective film covering at least the electrode pad, thereby preventing the electrode pad from being sandwiched between the sealant and the underside wiring,
    wherein,
        the protective film covers the imaging area, the underside wiring, and a connection region of the electrode pad, the connection region being an area where the electrode pad contacts the underside wiring.
2. The solid-state imaging device according to claim 1, wherein the electrode pad is segmented into the connection region connected to the underside wiring and an inspection region, and wherein the protective film has an opening that extends to the inspection region, and the opening has the sealant embedded therein.

3. The solid-state imaging device according to claim 1, further comprising:
   an insulating film covering the semiconductor substrate, wherein the electrode pad is disposed to be in contact with the insulating film and the underside wiring.

4. The solid-state imaging device according to claim 1, wherein the protective film has an opening that is spaced from the imaging area, the opening does not overlap the connection region of the electrode pad.

5. The solid-state imaging device according to claim 1, wherein the protective film is in contact with a portion of the underside wiring that is not in contact with the electrode pad.

6. The solid-state imaging device according to claim 2, wherein the opening is configured to permit a probe to be brought into contact with the inspection region of the electrode pad to inspect whether the optical sensors are defective or non-defective.

7. The solid-state imaging device according to claim 2, wherein the sealant fills the opening of the protective film and covers the inspection region of the electrode pad.

* * * * *